United States Patent [19]
Gibbons et al.

[11] Patent Number: 5,589,280
[45] Date of Patent: Dec. 31, 1996

[54] METAL ON PLASTIC FILMS WITH ADHESION-PROMOTING LAYER

[75] Inventors: Kevin P. Gibbons, Sunnyvale; Louis C. Lau, Alameda; Floyd E. Woodard, Los Altos, all of Calif.

[73] Assignee: Southwall Technologies Inc., Palo Alto, Calif.

[21] Appl. No.: 14,447

[22] Filed: Feb. 5, 1993

[51] Int. Cl.$^6$ ............... C23C 14/00; G02B 1/10; B32B 15/08; B32B 9/00

[52] U.S. Cl. ............... 428/626; 204/192.15; 204/192.16; 204/192.27; 359/584; 359/585; 359/839; 428/627; 428/660; 428/662; 428/663; 428/687; 428/458; 428/469; 428/480; 428/912.2; 428/913

[58] Field of Search ............... 428/458, 469, 428/480, 623, 626, 629, 912.2, 913, 624, 660, 687, 662, 663, 672, 673, 674; 359/839, 359, 360, 584, 585, 883, 884; 204/192.14, 192.15, 192.27, 192.16

[56] References Cited

U.S. PATENT DOCUMENTS

| | | | |
|---|---|---|---|
| 3,601,471 | 3/1969 | Seddon | 350/166 |
| 4,223,974 | 9/1980 | Masso | 350/1.7 |
| 4,358,507 | 11/1982 | Senaha et al. | 428/429 |
| 4,902,580 | 2/1990 | Gillery | 428/623 |
| 4,935,079 | 6/1990 | Nelson-Ashley et al. | 156/82 |
| 5,019,458 | 5/1991 | Elgat et al. | 428/630 |
| 5,124,173 | 6/1992 | Uchiyama et al. | 427/38 |
| 5,215,832 | 6/1993 | Hughes et al. | 428/623 |
| 5,216,551 | 6/1993 | Fuji | 359/884 |
| 5,276,600 | 1/1994 | Takase et al. | 362/320 |
| 5,306,547 | 4/1994 | Hood et al. | 428/213 |
| 5,361,172 | 11/1994 | Schissel et al. | 359/883 |

OTHER PUBLICATIONS

Hass, George, et al., eds., *Physics of Thin Films: Advances in Research and Development;* Academic Press, NY, (1982) 12:36–39.

*Primary Examiner*—D. S. Nakarani
*Assistant Examiner*—Stephen Sand
*Attorney, Agent, or Firm*—Burns, Doane, Swecker & Mathis, LLP

[57] ABSTRACT

The adhesion to plastic substrates of thick layers of functional metals having an oxide heat of formation that is greater than −40,000 calories/gram atom of metal, such as silver, copper, gold, and the like, is improved if a thin layer of a metal having an oxide heat of formation of less than −50,000 calories/gram atom of metal is present as an adhesion-promoting primer layer. When the primer layer metal has a melting point greater than 1100° C., it should be present as the metal or as a substoichiometric oxide. When the primer layer metal has a melting point less than 1100° C., it may be present as the metal, as a substoichiometric oxide, or as a full stoichiometric oxide. Processes for preparing these materials using sputter-depositing and reflectors incorporating these materials are also disclosed.

16 Claims, 3 Drawing Sheets

1

METAL ON PLASTIC FILMS WITH ADHESION-PROMOTING LAYER

BACKGROUND OF THE INVENTION

1. Field of the Invention

This invention concerns an improvement in metal-on-plastic surfaces, particularly films such as reflector films. More particularly, it provides such films and methods for their production which are characterized by having significantly enhanced adhesion between the metal component and the plastic film.

2. Background Information

Plastic sheets and films having a functional metal layer adhered to them are relatively commonplace today. They find application in products ranging from amusement balloons to high performance protective tapes to reflective windows. In an application favored for materials of the present invention, the functional metal layer is reflective and the metal-on-plastic films serve as highly specular (reflective) films for use in reflectors, particularly reflectors in fluorescent luminaires. While in some of these applications durability and performance are secondary considerations, in many cases product durability, and especially durability over long periods of time, is a critical performance property.

Southwall Technologies, Inc., the assignee of the present invention, has for several years marketed a reflective film product which is made up of a layer of polyester, such as poly(ethyleneterephthalate), coated with a thick (500–2000 Å) layer of sputter-deposited silver. This silver layer may, if desired for durability reasons or to improve handleability, be overcoated with a sputter-deposited metal or alloy such as nichrome, stainless steel, or the like. This product of Southwall Technologies, Inc. is flexible and can be laminated into the curved form of luminaire reflectors. In that application it has found wide acceptance. This product is capable of a very high degree of specularity that can only be achieved, in the case of plated materials, with very expensive precision plating techniques.

One difficulty that crops up with functional metal-on-plastic products of this type is an unpredictable level of adhesion of the metal layer to the plastic. This problem can manifest itself by delamination of the metal from the plastic. This delamination can be accelerated by harsh conditions such as high humidity, high salt content and the like. The delamination can result in a general failure of the product and, if reflectivity is key, a decided loss in this property.

This delamination can show up in several different configurations of metal-on-plastic films. For example, in one application an adhesive is applied to the metal layer and the plastic film plus metal layer is laminated to another surface. (This may occur in the reflector embodiment described above. In this case, the delamination causes the plastic film itself to physically separate from the other surface. This separation of the plastic is the direct result of the metal layer delaminating from the plastic film. In less severe, but often equally troubling cases, the breakdown in plastic-to-metal adhesion results in a breakdown of the consistent metal properties of the thick second film. If the adhesive is applied to the back of the plastic, delamination of the plastic from the other surface may not occur but instead the functional metal layer may come off the plastic.

The present invention seeks to provide improved metal-on-plastic products and methods for their manufacture. These products have improved adhesion between their functional metal layers and their plastic layers. In the case of reflective embodiments, they achieve this improvement without significant degradation of the total specular reflectance of the product.

STATEMENT OF THE INVENTION

In studying these metal-on-plastic materials we have come to understand that the thick functional metal layers that we desire to adhere to the plastic may be characterized as comprising metals having an oxide heat of formation that is greater than −40,000 calories/gm atom of metal. Such "functional" metals are those relatively inert metals which provide a functional property to the resulting metal-on-plastic product. Typical functional properties include light reflectance, electrical conductance or resistance, and catalytic activity. Representative "functional" metals include silver, copper, gold, palladium, iridium, rhodium, and the like. We have further found that the adhesion of these thick metal layers to plastic is dramatically improved if, instead of being sputter-deposited directly onto the plastic substrate, they are sputter-deposited onto a thin underlayer. This underlayer (also referred to as a primer layer) comprises one or more metals having an oxide heat of formation of less than −50,000 calories/gm atom of metal. These primer metals can be divided into two groups, with the first group being metals having a melting point that is greater than 1100° C. When one or more of these metals is the predominant component of the underlayer they should be in the form of the metal itself or be at most partially oxidized. The second group of these underlayer metals are those having a melting point that is less than 100° C. When one or more of these metals is the predominant component of the underlayer they may be fully (stoichiometrically) oxidized. In the case of zinc as a primer layer, it is preferred to have the zinc present in a substantially fully oxidized form to minimize migration into the functional metal layer. In both cases the underlayer should be laid down by sputter-depositing and should be from 3 to 200 Å thick.

Thus, in one embodiment this invention provides a metal-on-plastic material having improved metal to plastic adhesion which includes a plastic substrate having a surface, typically a two-dimensional flat surface. The material has a 3 to 200 Å first (primer) layer upon the surface of the substrate. This first layer comprises metal having an oxide heat of formation of less than −50,000 calories per gram atom of metal and a melting point that is greater than 1100° C. This first layer is present in the form of the metal or at most partially oxidized metal. This first layer should be laid down by sputter-depositing. While it is acceptable and often preferable to have minor amounts of oxygen present in the atmosphere or present on the surface of the plastic during metal lay down, so as to interact with the metal, the intent is to put down this underlayer as metal or substoichiometric oxide by sputtering in the "metal mode" as opposed to the "reactive" or "oxide" mode as these modes are known in the art. Partial oxidation can take place during the metal laydown or may occur thereafter. Upon the thin first layer is a thick second layer comprising 100 to 10,000 Å of functional metal having an oxide heat of formation of greater than −40,000 calories per gram atom of metal.

In a second embodiment this invention provides a metal-on-plastic material having improved metal-to-plastic adhesion which includes a plastic substrate having a surface with a 3 to 200 Å first layer upon the surface of the substrate comprising metal having an oxide heat of formation of less than −50,000 calories per gram atom of metal and a melting point that is less than 1100° C. This first layer is present in the form of a metal, a substoichiometric oxide or a stoichiometric oxide. In the case of zinc it is preferably in the form of a stoichiometric oxide. This first layer should be laid down by sputter-depositing either in the metal mode (and up-oxidizing thereafter) or in the metal oxide mode (by reactive sputtering). Upon the thin first layer is a thick second layer comprising 100 to 10,000 Å of functional metal having an oxide heat of formation of greater than –40,000 calories per gram atom of metal.

In many cases, including many embodiments of the reflector materials described in the background, it is desirable for the first (primer) layer to minimally interfere with the passage of light. In these settings, the thin underlayer employed preferably is of a composition and thickness within the above-recited ranges so as to exhibit a high visible transmission—that is, a transmission of greater than 90% of total visible light. This transmission property should be exhibited for this layer when the final product is completed. Typically, transmission goes up as the metal underlayer undergoes oxidation. As noted, this oxidation may take place prior to, during, or after the deposit of the layer of metal having an oxide heat of formation of greater than –40,000 calories/gm atom.

In preferred embodiments, another factor is taken into consideration. This factor is the surface energy of the plastic upon which the adhesion-promoting underlayer is deposited. In these preferred embodiments the surface energy of the plastic is adjusted, if needed, to greater than 50 dynes/cm$^2$. This can be accomplished by exposing the surface of the substrate to an argon, nitrogen or oxygen-containing plasma. This exposure will adjust this property.

Also, in preferred embodiments, the above-described metal-on-plastic materials are in the form of films. In addition, the thick layer of functional metal is preferably a reflective layer.

The metal-on-plastic materials can include one or more additional layers applied over the thick layer of functional metal. These additional layers can be layers of hardcoat, layers of a protective metal or the like. This layer can include a metal, a metal oxide, a metal nitride, a metal sulfide and/or organic or inorganic compounds known in the art of plastic films and metal coatings as hardcoats.

In many applications the metal-on-plastic materials are laminated to a support or other surface with laminating adhesive. This layer of laminating adhesive may be applied onto the "back" surface of the plastic material or directly onto the "front" surface of the thick functional metal layer or, and generally preferred, over the just-mentioned protective third layer of metal or hardcoat or the like.

In yet another embodiment, this invention provides light reflectors which are made of a metal or plastic reflector body having one of the above-described improved adhesion metal-on-plastic films adhered to it. This is accomplished either through adhesive applied to the "front" functional metal layer surface (with or without the intervening protective additional layers), or to the back side (nonmetalized side) of the plastic film.

In another embodiment, the invention provides methods for producing these films in which the first (thin) layer is sputter-deposited onto the plastic film and thereafter the second (thick) functional metal layer is sputter-deposited onto the first layer. The other layers, such as the protective overlayers, may be sputter-deposited as well, if appropriate.

DETAILED DESCRIPTION OF THE INVENTION

BRIEF DESCRIPTION OF THE DRAWINGS

This invention will be described with reference being made to the accompanying drawings in which.

DESCRIPTION OF PREFERRED EMBODIMENTS

Figure 1:
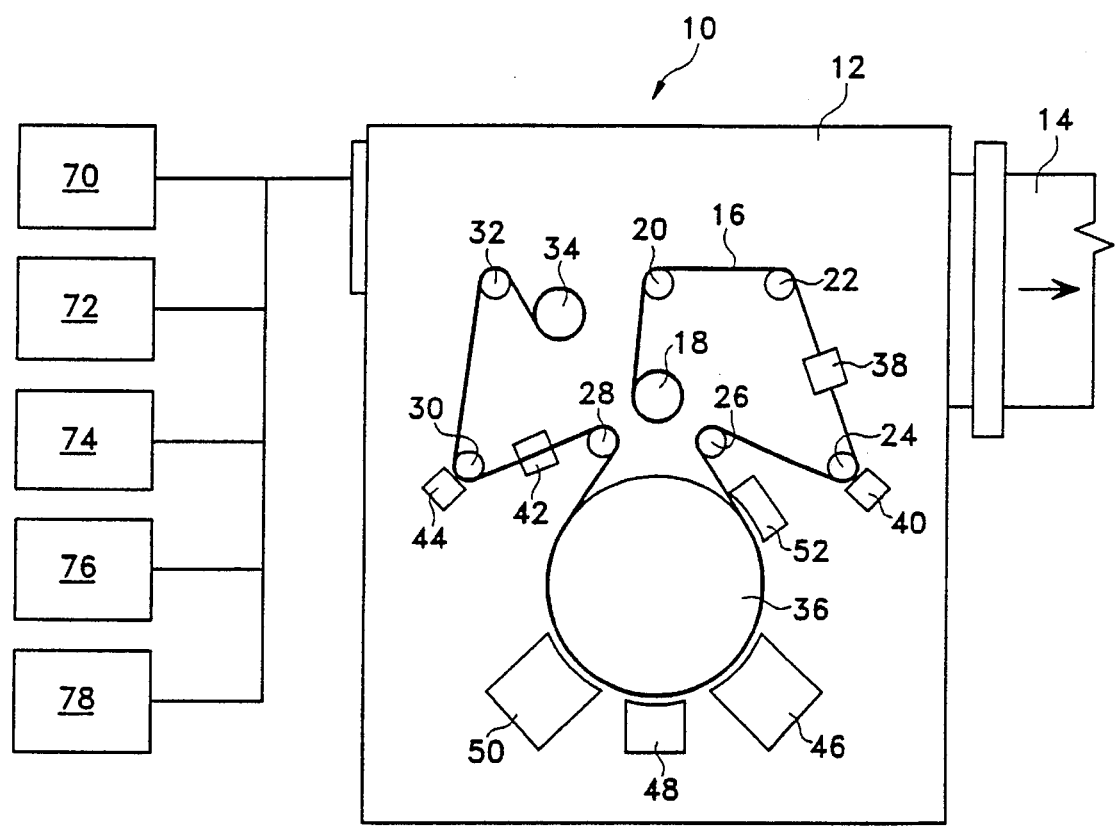
FIG. 1 is a schematic diagram of one form of apparatus which can be used to form the high adhesion metal-on-plastic films of this invention by sputter-depositing.

As was noted above, this invention is variously embodied as a process for producing a high-adhesion metal-on-plastic product and the product itself. The product comprises a polymer (plastic) surface with the thin adhesion-promoting layer and the thick metal layer thereon.

THE POLYMERS

The polymers which present the surfaces which benefit from the adhesion-promoting coating and process of this invention are carbon-based materials. They include organic polymers such as polyhydrocarbons, polyoxyhydrocarbons and polysulfohydrocarbons, and fluorocarbon and fluorohydrocarbon materials as well. Representative organic polymers include polyesters such as poly(ethyleneterephthalate) ("PET") and poly(butyleneterephthalate), polyacrylates and methacrylates such as poly(methylmethacrylate) ("PMMA"), poly(methacrylate), and poly(ethylacrylate), copolymers such as poly(methylmethacrylate-co-ethylacrylate) and polycarbonates. (A further description of suitable polyester and polycarbonate materials may be found at pages 129–135 of the McGraw-Hill *Encyclopedia of Science and Technology,* Volume 14 (1987).) Fluorocarbon polymers such as Teflon and the various fluorohydrocarbon polymers known in the art can be used as well.

Although not a limitation to the application of this invention, clear, transparent, colorless plastic materials give attractive final materials. When used in the context of plastic or polymer materials, the term "clear, transparent, colorless" means a plastic or polymer which, in its configuration of use, exhibits an integrated transmission over the visual wavelengths (400–700 nM) of at least about 75%, i.e., from about 70% to about 95% without marked absorption or reflection peaks in this range. These plastics are particularly advantageous in products which are employed as reflectors with reflection taking place through the plastic material. The polymers described above, when in typical configurations of use, (i.e., plastic sheets or 0.5 to 5 mil thick films) commonly have from about 5 to about 20% reflection plus absorption, integrated over the visual wavelengths and thus integrated transmissions in the 80 to 95% range, and can qualify as "clear, transparent, colorless" substrates. For example, a 1 to 3 mil thick film of commercial PET reflects and absorbs a total of about 10 to 15% of the visible light cast upon it.

The polymer substrates themselves are commercially available or can be prepared by various art-known processes and do not, in and themselves, constitute an aspect of this invention.

These polymers may be presented in any form which yields a polymer surface in need of adhesion promotion. Such surfaces can be provided by solid bodies, by films, or by coatings applied or laminated onto nonpolymeric surfaces such as glass.

THE THICK FUNCTIONAL METAL LAYER

The metal layers whose adhesion to the polymer layer is improved are made up of one or more functional metals having an oxide heat of formation greater than −40,000 calories/gm atom of metal. (When the expressions "oxide heat of formation" and "calories/gm atom of metal" are used together in this specification and claims they are to refer to the number of calories needed to convert one gram atom of metal into its corresponding oxide. Thus, it would be the amount of energy needed to convert one mole of tin into $SnO_2$, one mole of indium into $In_2O_3$ or one mole of silver into $Ag_2O$.)

A "functional" metal is a relatively inert metal which provides a functional property to a product when present as a 100-to-10,000 Å layer. Such functional properties include optical, electrical and physical-chemical properties. Optical reflectivity is a typical and preferred functional property. Representative functional metals include copper, silver, gold, palladium, iridium, rhodium, and the like. Among these metals, copper, silver and gold are preferred, with silver being the most preferred metal. This metal layer, which is laid down by sputtering, particularly magnetron sputtering, as will be described hereunder, is typically a relatively thick layer. That is, the layer can range from about 100 Å in thickness up to about 10,000 Å in thickness, with preferred thick metal layers being between about 500 Å and 3000 Å, and most especially from about 1000 Å to about 3000 Å in thickness. Individual metals may be used, or a plurality of layers of different metals meeting the above-described heat of formation limitation, or layers of alloys of these metals may be used, if desired.

THE ADHESION-PROMOTING LAYER

The adhesion-promoting layer, which is positioned between the plastic substrate and the reflective metal layer, is made up of one or more metals characterized by having an oxide heat of formation of less than −50,000 calories/gm atom of metal.

As shown in Table I, metals which meet the requirement of having an oxide heat of formation below −50,000 calories/gm atom of metal include: hafnium, zirconium, tantalum, titanium, niobium, silicon, tungsten, aluminum, vanadium, molybdenum, chromium, tin, antimony, indium, zinc, bismuth, cadmium, nickel and the like. Table II lists these same metals as a function of their melting points so that those low-melting metals in the group which may be deposited as oxides can be determined.

TABLE I

Heats of Formation for Various Oxides.

| Metal | Metal Oxide (Crystalline) | Heat of Formation kCal/mole @25° C. | Heat of Formation per mole of metal |
|---|---|---|---|
| Hf | $HfO_2$ | −273.6 | −273.6 |
| Zr | $ZrO_2$ | −263.0 | −263.0 |
|    | $ZrO_3$ | −241.0 | −241.0 |
| Ta | $Ta_2O_5$ | −489.0 | −244.5 |
| Ti | $Ti_2O_3$ | −363.5 | −181.8 |
|    | $TiO_2$ (rutile) | −225.8 | −225.8 |
|    | TiO (α) | −124.2 | −124.2 |
| Nb | NbO | −97.0 | −97.0 |
|    | $NbO_2$ | −189.2 | −189.2 |
|    | $Nb_2O_5$ | −451.5 | −255.8 |
| Si | $SiO_2$ (quartz) | −217.7 | −217.7 |
| W  | $WO_2$ | −140.9 | −140.9 |
|    | $WO_3$ | −201.5 | −201.5 |
| Al | $Al_2O_3$ | −397.6 | −198.8 |
| V  | VO | −103.2 | −103.2 |
|    | $V_2O_3$ | −291.3 | −145.7 |
|    | $V_2O_4$ | −341.1 | −170.6 |
|    | $V_2O_5$ | −370.6 | −185.3 |
|    | $V_3O_5$ | −462.0 | −154.0 |
|    | $V_4O_7$ | −631.0 | −157.8 |
|    | $V_6O_{13}$ | −1,062 | −177.0 |
| Mo | $MoO_2$ | −178.1 | −178.1 |
|    | $MoO_3$ | −140.8 | −140.8 |
| Cr | $CrO_3$ | −140.9 | −140.9 |
|    | $Cr_2O_3$ | −272.4 | −136.2 |
| Sn | SnO | −68.3 | −68.3 |
|    | $SnO_2$ | −138.8 | −138.8 |
| Sb | $Sb_2O_4$ | −216.9 | −108.5 |
|    | $Sb_2O_5$ | −232.3 | −116.2 |
| In | $In_2O_3$ | −221.3 | −110.6 |
| Zn | ZnO | −83.2 | −83.2 |
| Bi | $Bi_2O_3$ | −137.2 | −68.6 |
| Cd | CdO | −61.7 | −61.7 |
| Ni | NiO | −57.3 | −57.3 |
|    | $Ni_2O_3$ | −117.0 | −58.5 |

TABLE II

| Metal | Metal Melting Point in °C. |
|---|---|
| W  | 3410 |
| Ta | 2996 |
| Mo | 2610 |
| Nb | 2468 |
| Hf | 2150 |
| Cr | 1890 |
| V  | 1890 |
| Zr | 1852 |
| Ti | 1675 |
| Pd | 1552 |
| Ni | 1453 |
| Si | 1410 |
| Cu | 1083 |
| Ag | 961 |
| Cd | 765 |
| Al | 660 |
| Sb | 631 |
| Zn | 419 |
| Bi | 271 |
| Sn | 232 |
| In | 157 |

As already noted, in many embodiments of this invention it is advantageous to provide an adhesion-promoting layer which is substantially transparent. The term "substantially transparent", when used in the context of an adhesion-promoting layer or an optional topcoat layer, is defined as follows. A "substantially transparent" layer, when interposed in a light path, reduces the reflectance of a reflective metal layer, integrated over the visual wavelengths of 400–700 nM, by no more than 10 and preferably 5 percentage points relative to the reflectance measured in the absence of the layer.

Since some of the metals considered here for the adhesion-promoting layer exhibit substantial absorption in their metal state (i.e., >3% absorption at thicknesses less than 20 Å), it may be advantageous to either sputter them as full or partial oxides, depending upon whether, based on their melting points, they may be present as full or partial oxides. Similarly, it may be advantageous to up-oxidize the metal layers fully or partially after their deposition.

Generally, the method for producing the adhesion-promoting layer is to magnetron-sputter the metal fully or partially in the metal mode. The term "metal mode" is known in the art. In this technique either no oxygen or a limited amount of oxygen is made available during the sputtering process so as to control the degree of oxidation and to allow the electrode itself to present a metal rather than metal oxide surface. For most of the metals considered (i.e., those with melting points higher than 1100° C., for example hafnium, zirconium, tantalum, titanium, niobium, silicon, tungsten, aluminum, vanadium, molybdenum, chromium, antimony, bismuth, cadmium, nickel and the like) it is important that they be deposited as metals or as substoichiometric oxides with no more than 75% of the metal being oxidized.

If a adhesion-promoting metal layer is sputtered in an oxygen-deficient environment, its transparency generally may be increased thereafter by the following techniques: exposing the layer, with or without the thick metal layer or any overlayers, to atmospheric oxygen for several days; heating the layer, with or without the thick metal layer or any overlayers, in oxygen for several hours; or passing the adhesion-promoting metal layer through an oxidative plasma prior to sputter-depositing the thick metal layer.

If a relatively thick adhesion-promoting layer (i.e., $\geq 30$ Å) is deposited and "substantial transparency" is desired, it is often advantageous for the adhesion-promoting layer to be substantially oxidized prior to deposition of the reflective layer. This is because such thick layers are not readily oxidized to desired levels of transparency by oxidative processes carried out after the reflective metal layer is deposited.

Certain metal oxides (i.e., those based on metals with melting points less than 1100° C. such as indium, zinc, and tin) may be deposited in the oxidized mode (i.e., sputtered in the presence of an excess of oxygen so that the metal is fully oxidized) and still achieve the desired adhesion promotion.

The adhesion-promoting layer can be a mixture of two or more of the metals meeting the above-described criteria.

OPTIONAL ADDITIONAL TOPCOAT LAYERS

Very typically, the reflective thick metal layer is overcoated with one or more additional layers to improve chemical inertness, to enhance corrosion resistance, to provide physical robustness, or to improve handleability of film (i.e., reduce "static cling" of adjacent layers in a web).

The additional layers may consist of one or more relatively thin (i.e., less than 10,000 Å in thickness with 20 to 250 Å being typical) sputter-deposited materials which function to improve chemical inertness or improve handleability of the film. Materials for this purpose can include inorganic materials such as sputter-deposited metals, metal oxides, metal nitrides, metal sulfides or metal carbides. One example of such a topcoat is discussed in U.S. Pat. No. 4,666,263. Typical materials for this purpose include: chromium, nickel chromium, Inconel, Monel, type 316 stainless steel, indium oxide, tin oxide, titanium oxide, zinc oxide, titanium nitride, zirconium nitride, silicon carbide, zinc sulfide, and the like.

Alternatively or additionally, a relatively thick (i.e., greater than 1 µm in thickness) organic or silicon-based hardcoat can be provided to enhance corrosion resistance, to provide physical robustness. These layers are generally applied in a liquid form and thermally or radiatively cured. Typically, these layers are silica hardcoats, acrylate hardcoats, methacrylate hardcoats, polyolefin (e.g., polypropylene) layers and the like.

One advantageous combination of optional layers for silver-based reflectors is a first layer upon the reflective silver layer and a second layer upon the first. The first layer is a relatively thin inorganic layer, for example about 20 to 200 Å, of a transparent layer such as a metal oxide or sulfide, for example, indium oxide, tin oxide, or zinc oxide. This layer functions as a protective layer. On the inorganic layer is deposited a thicker organic or silicon-based hardcoat layer as described above.

Adhesive can be applied to the "back" side of the plastic film and the product can then be laminated to a support such as a reflector base. The construction described here, when applied to reflective functional metal layer materials, produces a robust "front surface" mirror in which reflection occurs off of the reflective metal layer through the hardcoats. In this configuration, although an adhesion-promoting layer between the reflective layer and the plastic substrate is still required, it is not imperative than it be transparent.

In the reverse construction with reflective functional layers, where adhesive is applied to the "front" side, directly to the functional metal layer or overcoat layer, and then this surface is laminated to a substrate, the optical properties of the topcoats do not enter into the reflectance performance of the reflective metal layer. That is because this is a "back surface" mirror. The light being reflected passes through the plastic film, through the adhesion-promoting layer, reflects off the reflective metal layer and exits in a similar fashion. In this configuration, control of the transparency of the adhesion-promoting layer is essential.

METHODS FOR PRODUCTION

The high adhesion, metal-on-plastic films are prepared using sputter-depositing. Sputter-depositing is a commercial process for depositing inorganic materials such as metals, oxides, and the like on surfaces. Representative descriptions of sputter-depositing processes and equipment may be found in U.S. Pat. Nos. 4,204,942 and 4,948,087, which are incorporated by reference.

In sputtering, a voltage is applied to a metal or metal compound sputtering cathode (target) in the presence of a gas to create a plasma. The action of the sputtering gas plasma on the target causes atoms of the target to be dislodged and to travel and deposit upon a substrate positioned adjacent to the sputtering source.

The thickness of the layer of material laid down is controlled by varying the voltage and current fed to the electrode targets, the gas flow rates and, in the case of continuous systems where the polymer surface and sputtering target move relative to one another, the speed at which the surface is moved past the target.

Typically, the sputtering gas is a nonreactive noble gas such as krypton or argon or the like. Argon is the most common sputtering gas because of its relatively attractive cost. In some sputtering processes, known as reactive sputtering processes, one adds substantial amounts of one or more reactive gases such as oxygen or nitrogen during the metal lay down. This results in a compound such as an oxide or nitride being formed and deposited.

As applied to the present invention, the first metal layer, that is, the adhesion-promoting metal layer having an oxide heat of formation less than −50,000 calories per gram atom, is sputter-deposited onto the plastic substrate. Thereafter, the thick layer of the functional metal having an oxide heat of formation greater than −40,000 calories per gram atom is sputter-deposited onto the adhesion-promoting layer.

In those cases where the adhesion-promoting layer is composed of metals having melting points below 1100° C., the sputter-depositing can be carried out in the presence of an excess of oxygen so as to give rise to fully oxidized materials. For those cases where the adhesion-promoting layer is to be laid down as a metal or with at most substoichiometric levels of incorporated oxygen, it is often not necessary to intentionally add substantial amounts of oxygen during the sputtering. Minor amounts of oxygen are commonly picked up off of the surface of the substrate or enter the sputtering zone due to leaks, contamination or the like.

If desired, one can generally add minor amounts of oxygen during the lay down of the adhesion-promoting layer, even with those metals having melting points greater than 1100° C. In the case of these metals, however, one must insure that the material as laid down by sputtering in the metal mode that is in an oxygen-deficient atmosphere as evidenced by a substantial residual visible absorption (i.e., greater than 2 percentage points) for the adhesion-promoting layer as originally laid down.

If desired, the laydown of the thin metal layer can be preceded by a mild pre-glow treatment to improve adhesion. This use of pre-glow relates to the finding that it is desirable to have the plastic film in a condition such that its surface has a surface energy of greater than 50 dynes per cm$^2$.

This pre-glow can be carried out in the presence of oxygen, the presence of air, or the presence of argon or the like. Typically, oxygen and air glows attain a higher surface energy than can be achieved with an argon glow.

FIG. 1 shows a continuous web coating sputtering system 10 suitable for laying down these various layers. System 10 includes vacuum chamber 12 which is evacuated via line 14. Contained within chamber 12 is a drive mechanism for moving a sheet of flexible polymer film 16 past a series of magnetron sputtering stations 50, 48, and 46. The drive mechanism includes feed roll 18, idlers 20, 22, 24, 26, 28, 30 and 32 and take-up roll 34.

The film passes around chilled idler drum 36 as well. The film passes a pair of monitors for determining its transmittance, 38, and reflectance, 40, before coating and a similar pair of monitors 42 and 44 after coating. This coater is configured to simultaneously sputter-deposit up to three layers on the plastic film using three separate DC magnetron cathodes 46, 48 and 50. Typically, cathode 46 is used to lay down the adhesion-promoting thin metal layer. Cathode 48 can be used to lay down the thick, functional (e.g. reflective) metal layer. Cathode 50 can be used to lay down an overcoating layer, if desired. Also located in the system is a pre-glow station 52 for optional ionized gas cleaning or surface energy adjustment of the plastic film before coating. Each of these four stations is isolated from each other in space as a minichamber (see U.S. Pat. No. 4,298,444), thereby producing a local environment for the containment of the various plasma gasses. This allows separate processes to be carried out simultaneously at each station with variations in atmosphere from station to station but with minimal cross-contamination among the four sources.

The control and monitoring of the sputtering system are normally accomplished using equipment and sensors which are common in machines of this type. These are shown in FIG. 1 and include: 1) mass flow controllers (MKS) for regulation of gas flow into the cathode minichambers; 2) 5–10 kilowatt DC power supplies (Advanced Energy) for all three sputtering cathodes; 3) an optical monitoring system (Hexatron/Southwall Technologies) which measures both reflectance and transmission of the film over the spectral region from 360 to 2000 nm; and 4) a film motion control system (Drivex) which regulates the tension, speed, and distance of the film as it moves through the system.

PRODUCT STRUCTURES

Figure 2:
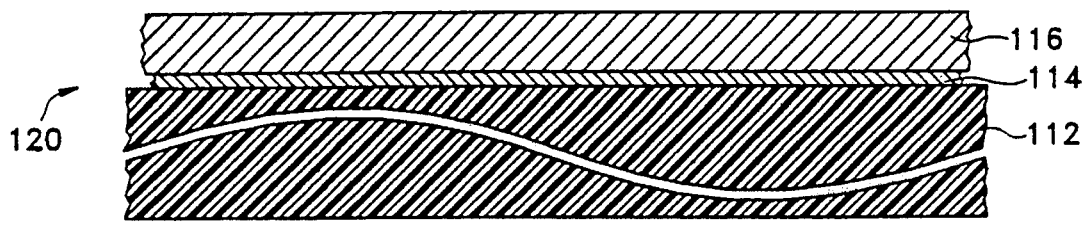
FIG. 2 is a not-to-scale schematic cross-section of an improved adhesion metal-on-plastic product of this invention.

A typical structure of a product of this invention is shown in FIG. 2 as 120. This includes a plastic film substrate 112. This film substrate may have been subjected to a plasma surface treatment or other chemical surface treatment to modify its surface to obtain a surface energy of greater than 50 dynes per cm$^2$. Deposited upon this surface is an adhesion-promoting layer 114 comprising a metal having an oxide heat of formation of less than −50,000 calories per gram atom of metal. Deposited upon this layer 114 is a thick layer 116 of functional metal having a heat of formation greater than −40,000 calories per gram atom of metal.

Figure 3:
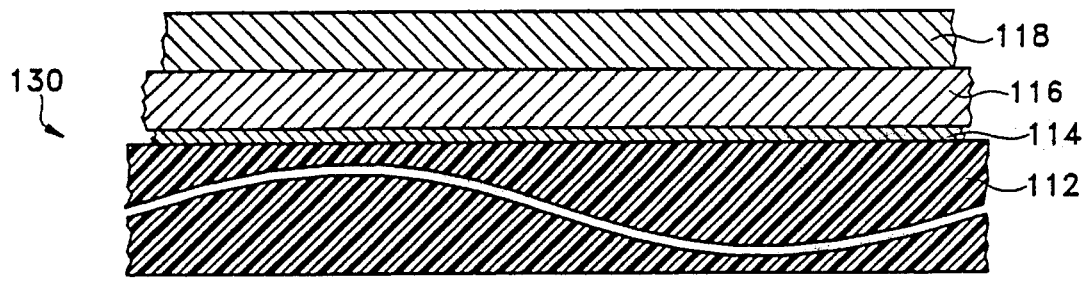
FIG. 3 is a schematic cross-section of a metal-on-plastic material of this invention including, in addition, a protective outer layer over the metal layer.

In FIG. 3 this same film composition is shown as part of structure 130. Structure 130 includes an additional layer 118. This additional layer 118 is a protective overcoating layer. As noted above, it can be an inorganic material such as from about 20 to several hundred Å of a metal or metal compound such as oxide, sulfide or carbide, or it can be a relatively thick organic or silicon-based hardcoat.

Figure 4:
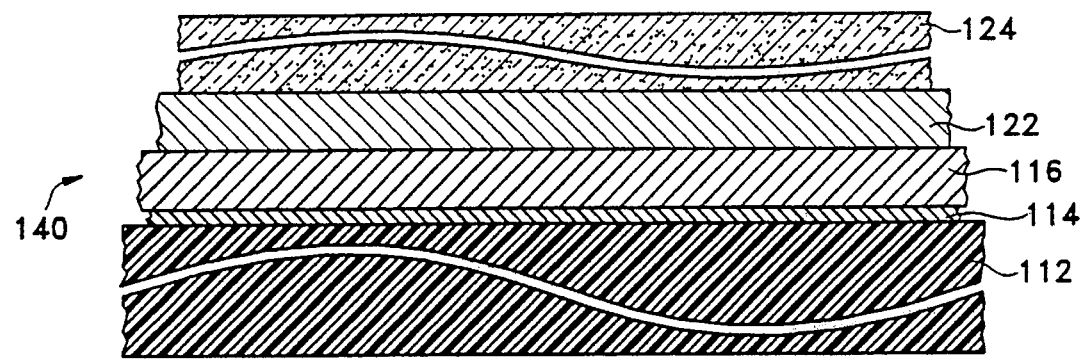
FIG. 4 is a schematic cross-section of a metal-on-plastic material of this invention as shown in FIG. 3 in which the protective outer layer is made up of a metal or metal compound layer overcoated with a hardcoat.

In FIG. 4, a coated film 140 is shown which has a particularly preferred overcoating structure. This overcoating structure includes a first layer 122 made up of 20 to several hundred Å of metal or metal compound covered with a thicker hardcoat layer 124.

Figure 5:
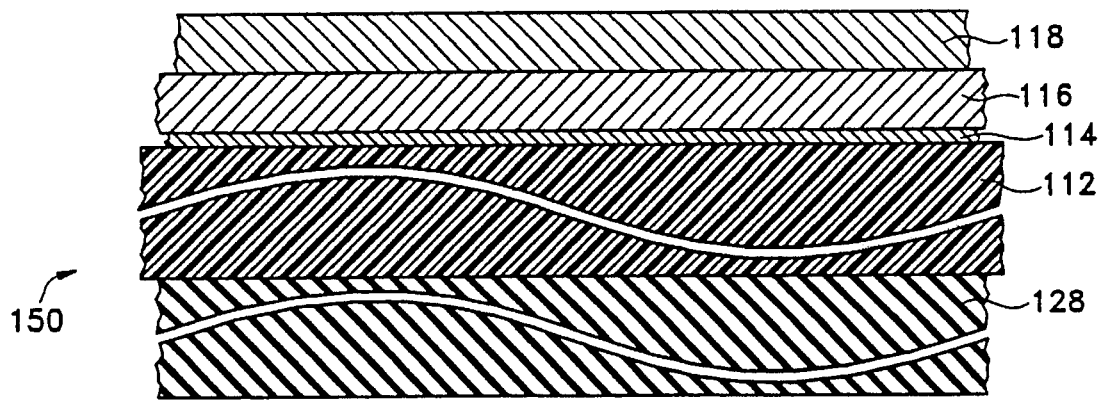
FIG. 5 is a schematic cross-section of a metal-on-plastic material of this invention including an adhesive layer adhered to the "back" side of the plastic substrate.
Figure 6:
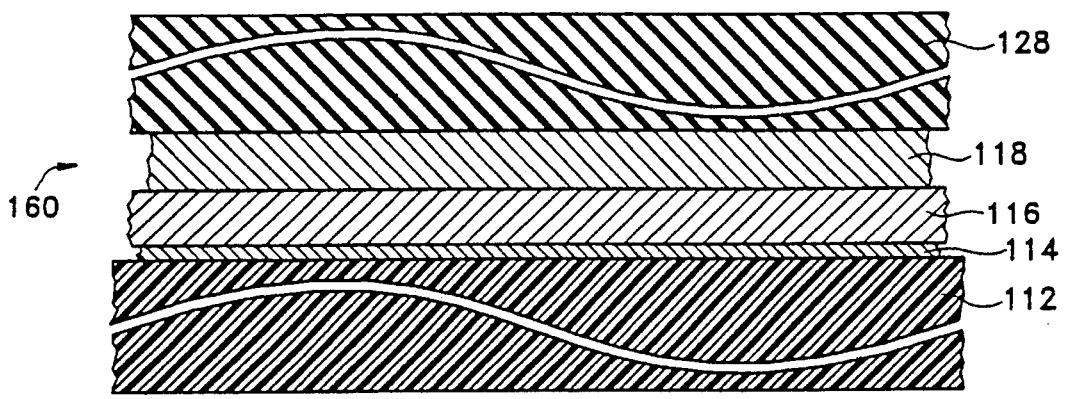
FIG. 6 is a schematic cross-section of a metal-on-plastic material of this invention including an adhesive layer adhered to its metal layer-bearing or "front" side.

As illustrated in FIGS. 5 and 6, any of the structures shown in FIGS. 2 through 4 can be further coated with an adhesive layer 128 on either the plastic film side (structure 150, FIG. 5) or on the metal coated side (structure 160, FIG. 6). Layer 128 is typically formed from adhesive materials that are well known and used in the plastic laminating art and include for example, poly(isobutylene) and the like.

Adhesive layer 128 may be covered with a temporary tear-away protective layer (not shown) for transporting or handling the adhesive-coated film.

Figure 7:
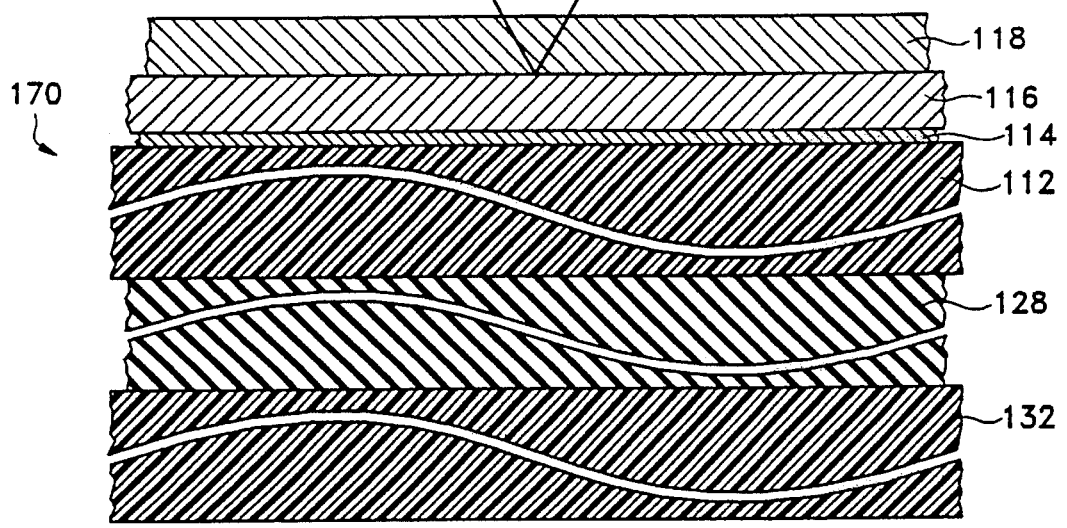
FIG. 7 is a schematic cross-section of the metal-on-plastic material of FIG. 5 back-laminated to a backing support such as a reflector body to give rise to a reflector. This reflector is shown reflecting light off of its reflective metal layer through its optional protective outer layer.
Figure 8:
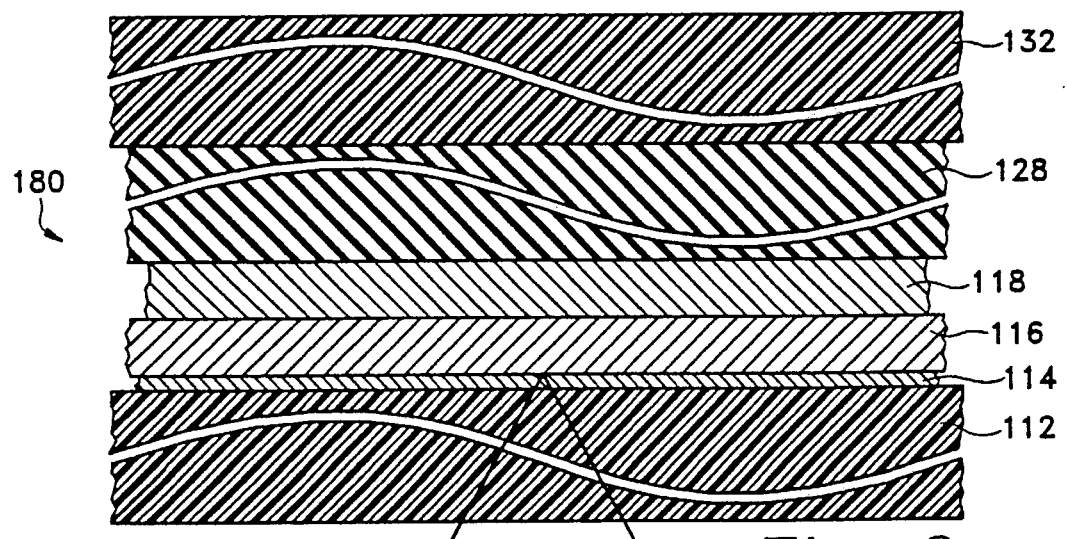
FIG. 8 is a schematic cross-section of the metal-on-plastic material of FIG. 6 front-laminated to a backing support such as a reflector body to give rise to a reflector. This reflector is shown reflecting light off of its reflective metal layer through its plastic substrate and adhesion-promoting primer layer.

Adhesive layer 128 is useful for adhering the metal-on-plastic structures to a support or the like. In FIGS. 7 and 8 structures 150 and 160 are shown as a part of reflectors 170 and 180, respectively, adhered to a support backing 132. This backing 132 is shown as a reflector body but can be any other surface to which the film of the present invention is desired to be laminated.

In the case of reflector 170, light can pass through overcoating layer 118 to reflect off of thick functional metal layer 116 and pass back out through layer 118. In this structure, it is advantageous if the protective layer 118 is durable enough to protect the reflective metal layer and also that it be relatively transparent, so as to allow high degrees of reflection.

In the case of reflector 180, light can pass through plastic film 112, then through adhesion-promoting layer 114 to reflect off of thick metal layer 116 and pass back out through layer 114 and film 112. In this structure, it is advantageous if film 112 and layer 114 are relatively transparent, so as to allow high degrees of reflection.

In another embodiment, the adhesive could be applied to the backside of film 112. Using this adhesive the film could be laminated onto a backing such as a lighting unit or the like.

In any of these embodiments, the presence of layer 114 improves the adhesion of the thick, functional metal layer 116 to plastic film 112.

The invention will be further described by the following examples. These are provided to describe the invention and are not to be construed as limiting its scope.

EXAMPLE 1

The process and product of this invention were demonstrated in a laboratory-scale production run denominated "LC1-23-32-3" in the summary provided in Table III.

A roll of 0.001 mil thick PET (Mylar D by Dupont) was loaded into the sputtering machine depicted in FIG. 1. The roll was oriented so that the non-slip or untreated side of the roll faced the sputtering targets. A titanium target (5"× 15.625") was installed into the position marked 46 in FIG. 1. A silver target (3.25"×15.625") was installed into the position marked 48. A nichrome target (80% nickel/20% chrome with dimensions of 5"×15.625") was installed into position 50. After pumping down to $2 \times 10^{-5}$ Torr, an air flow of 17.5 sccm was introduced in the dc glow chamber (position 52 in FIG. 1) to obtain a pressure of $1.2 \times 10^{-2}$ Torr. The glow was powered with a dc voltage of 1500 V to obtain a current of 75 mA. The polymer film was advanced at a velocity of 20 m/sec.

A flow of 11.2 sccm of argon was introduced into the minichamber surrounding the titanium target (i.e., position 46 in FIG. 1) to obtain a pressure of $3 \times 10^{-3}$ Torr. Power was applied to the titanium target (0.37 kW) and titanium was sputter-deposited onto the freshly "glowed" polymer film substantially in the form of titanium metal. No specific addition of oxygen was carried out. The power was selected to yield a thin adhesion-promoting layer of titanium which reduced the visible transmission of the substrate by 4.2 percentage points (i.e., from 88.8% to 84.6%) as determined by "in situ" measurement. (This transmission reduction by this measurement correlates experimentally to a titanium layer thickness of approximately 14 Å. Although somewhat machine dependent in absolute values, transmission reduction is a function of layer thickness. For example, for titanium at "2%" layer is about 11 Å thick, a "4%" layer is about 14 Å thick, and an "8%" layer is about 20 Å thick. For NiCr, a "2%" layer is about 5 Å and a "5%" layer is about 7 Å thick.) The run was continued until a length of polymeric web was dc glowed and coated. (This part of the run is summarized in Table III as "Pass I" of "Sample Number LC1-23-32-3". In this summary the abbreviation "AirGlw/ Ti(4%)" stands for "Air Glow followed by titanium coating to a visible transmission drop of 4%.")

The roll was then reversed and a second coating operation was performed. A flow of 27.4 sccm of argon was introduced into the silver minichamber (position 48, FIG. 1) to obtain a pressure of $4.5 \times 10^{-3}$ Torr. The silver target was powered at 4.0 kW with the plastic film moving at 20 mm/sec and silver was sputter-deposited onto the titanium underlayer at a silver layer thickness of approximately 1000 Å.

A flow of 21.5 sccm of argon was introduced into the nichrome minichamber to obtain a pressure of $3 \times 10^{-3}$ Torr. The nichrome electrode was powered at 0.89 kW and a nichrome protective overlayer was sputter-deposited onto the newly deposited reflective silver layer. Based on extrapolations from thicker samples prepared at higher powers and lower line speeds, the nichrome layer thickness in this sample was approximately 14 Å. This part of the experiment is summarized in Table III as "Pass II" of LC1-23-32-3.

The visible reflectivity (Rvis) of the resulting film as measured from the PET side within 24 hours from the completion of manufacturing was 95.5%. This is essentially the same reflectivity as was obtained when a sample having no adhesion-promoting layer but otherwise identical to LC1-23-32-3 was used. Thus, although the titanium was deposited without oxygen added to the plasma and initially led to a visible light transmission loss of about 4 percentage points in the resulting sample, the titanium primer layer appeared to be almost completely oxidized, as evidenced by the insignificant reduction of the reflection of the silver layer when measured after the completion of the silver and nichrome layer deposit. An indication of the ease with which titanium films are oxidized to become transparent was observed by monitoring the transmission of the 4% titanium film in the vacuum chamber. Even in the absence of intentionally added oxygen, the transmission increased by more than 1 percentage point in 30 minutes.

This silver sample, sample number LC1-23-32-3, was laminated to 0.015" thick cold-rolled steel using Morton Thiokol 503A adhesive. The adhesive was placed between the top sputtered nichrome layer and the steel. The laminated sample was subjected to a 30 minute, 77° C. heat treatment and its reflectivity was remeasured. In the case of this material this heat treatment had no effect, indicating that the titanium underlayer, although laid down in a metal mode, had substantially up-oxidized to titanium oxide during subsequent processing steps.

TABLE III

| SAMPLE NUMBER | SAMPLE PREPARATION DESCRIPTION | | | NaCl % Cor | Rvis |
|---|---|---|---|---|---|
| | Pass I | Pass II | Pass III | | |
| LC1-23-32-2 | AirGlw/Ti(2%) | Ag/NiCr | | 15 | 96.2 |
| LC1-23-32-3 | AirGlw/Ti(4%) | Ag/NiCr | | 7 | 95.5 |
| LC1-23-32-4 | AirGlw/Ti(8%) | Ag/NiCr | | 3 | 93.3 |
| LC1-23-35-1 | AirGlw/Ti(2%) | O2Glw/Ag/NiCr | | 8 | 95.9 |
| LC1-23-35-2 | AirGlw/Ti(4%) | O2Glw/Ag/NiCr | | 0 | 96.1 |
| LC1-23-35-3 | AirGlw/Ti(8%) | O2Glw/Ag/NiCr | | 0 | 95.9 |
| LC1-23-36-1 | ArgonGlw/Ti(4%)/Ag/NiCr | | | 5 | 96.1 |
| LC1-23-36-2 | No Glw/Ti(4%)/Ag/NiCr | | | 50 | 96.3 |
| LC1-23-36-3 | Air Glow | TiO2(20Å) | Ti(4%)/Ag/NiCr | 20 | 93 |
| LC1-23-38-1 | Air Glow | W(4%)Ag/NiCr | | 3 | 93.3 |
| LC1-23-40-3 | AirGlw/W(4%)/Ag/NiCr | | | 20 | 96.1 |
| LC1-23-41-1 | AirGlw/WO3(30Å)/Ag/NiCr | | | 100 | 94.1 |
| LC1-23-42-3 | AirGlw/In(4%)/Ag/NiCr | | | 0 | 95 |
| LC1-23-42-4 | AirGlw/In2O3(30Å)/Ag/NiCr | | | 2 | 95.6 |
| LC1-23-43-1 | AirGlw/Zn(4%)/Ag/NiCr | | | 30 | 88 |
| LC1-23-43-2 | AirGlw/ZnO(30Å)/Ag/NiCr | | | 3 | 96.6 |
| LC1-23-43-5 | AirGlw/Al(4%)/Ag/NiCr | | | 10 | 96.3 |
| LC1-23-44-3 | AirGlw/Ta(4%)/Ag/NiCr | | | 15 | 96.4 |
| LC1-23-44-4 | AirGlw/Ta2O5(4%)/NiCr | | | 100 | 86.7 |
| LC1-23-45-1 | AirGlw/Ni(4%)/Ag/NiCr | | | 0 | 92.6 |
| LC1-23-45-2 | AirGlw/NiOx(4%)/Ag/NiCr | | | 100 | 95.3 |
| LC1-23-45-3 | AirGlw/Cr(4%)/Ag/NiCr | | | 7 | 95.2 |
| LC1-23-45-4 | AirGlw/CrO2(30Å)/Ag/NiCr | | | 100 | 94.1 |

EXAMPLE 2

This example illustrates that certain metals having oxide heats of formation greater than −40,000 calories/gram atom of metals (namely those with melting points greater than 1100° C.), when deposited as stoichiometric oxides, do not effectively promote corrosion-resistant adhesion of silver to a plastic substrate.

In this experiment (listed as LC1-22-88-9 in Table IV) the substrate was pre-glowed, an approximately 14 Å layer of titanium oxide was deposited, an approximately 1000 Å layer of silver was deposited, and an approximately 50 Å thick layer of nichrome was deposited, all in a single pass using all four sputtering positions in the machine shown in FIG. 1 (i.e., positions 52, 46, 48, and 50).

The glow was carried out at a pressure of $1.2 \times 10^{-3}$ Torr with an air flow to the glow chamber of 18 sccm, a voltage of 1500 V, and a current of 75 mA. The titanium target was powered at 3.5 kW with 4.2 sccm of argon and 10 sccm of oxygen to obtain a minichamber pressure of $3.06 \times 10^{-3}$ Torr. (The titanium target was operating in the oxidized mode to produce essentially fully stoichiometric $TiO_2$ with no significant (less than 1%) visible absorption.) The silver target was powered at 0.84 kW with an argon flow of 19.5 sccm and a minichamber pressure of $3.0 \times 10^{-3}$ Torr.

This silver sample, sample number LC1-22-88-9, was laminated to 0.015" thick cold-rolled steel using 5 minute Epoxy (Tru Bond) adhesive. The adhesive was placed between the top sputtered nichrome layer and the steel. The sample was then placed in a salt fog chamber operated at 95° C. and 95% RH as described in ASTM B117. After about three days exposure the sample exhibited massive delamination between the silver layer and the PET as reported in Table IV.

Similar samples made without an adhesion-promoting layer between the silver and PET, and with and without a pre-glow, also exhibited delamination of the PET from the silver coating. These results are given in Table IV as samples LC1-22-88-1 and LC1-22-88-2. However, the stoichiometrically oxidized titanium oxide primer layer present in sample LC1-22-88-9 appeared to actually hurt silver adhesion and to make the sample more prone to delamination during salt fog exposure than samples LC1-22-88-1 and LC1-22-88-2.

The "no adhesion-promotion layer samples", LC1-22-88-1 and 2, are of interest as providing a "base line" reflectivity of about 95%. This indicates that materials of the invention, such as the material of Example 1, at worst are only very minimally disadvantaged in their absolute reflectivity performance by having their adhesion-promoting layers present.

TABLE IV

| SAMPLE NUMBER | SAMPLE PREPARATION DESCRIPTION | Degree of Corrosion in Salt Fog Exposure | Rvis BHT | Rvis AHT |
|---|---|---|---|---|
| LC1-22-88-5 | Air Glow/Ti (5%)/Ag/NiCr | Slight Corrosion | 92.8 | 95 |
| LC1-22-88-6 | Air Glow/Ti (5%)/Ag/NiCr | Slight Corrosion | 94.7 | 95.5 |
| LC1-22-88-9 | Air Glow/TiO2 (20Å)/Ag/NiCr | Massive Corrosion & Delamination | 91.7 | N/A |
| LC1-22-89-1 | Air Glow/NiCr (5%)/Ag/NiCr | No Corrosion | 91.9 | 93.2 |
| LC1-22-89-2 | Air Glow/NiCr (2%)/Ag/NiCr | Slight Corrosion | 93.6 | 95.2 |
| LC1-22-89-3 | Air Glow/ NiCrOx(20Å)/ Ag/NiCr | Massive Corrosion | 91.9 | N/A |
| LC1-22-88-1 | No Glow/Ag/ NiCr | Corrosion and Delamination | 95 | N/A |
| LC1-22-88-2 | Air Glow/Ag/ NiCr | Corrosion and Delamination | 95 | N/A |

EXAMPLES 3–6

The paired experiments of Examples 1 and 2 were repeated four times varying the metal and metal oxide of the adhesion-promoting layer. The results are given in Tables III and IV.

In Example 3 tungsten and tungsten oxide were compared. Samples LC1-23-40-3 and LC1-23-38-1 show that tungsten effectively improved adhesion. Sample LC1-23-

41-1 shows that tungsten deposited as tungsten oxide did not.

In Example 4, nickel and nickel oxide were compared. Sample LC11-23-45-1 shows that nickel effectively improved adhesion. Sample LC1-23-45-2 shows that nickel deposited as nickel oxide did not.

In Example 5 tantalum and tantalum oxide were compared. Sample LC1-23-40-3 shows that tantalum effectively improved adhesion. Sample LC1-23-41-1 shows that tantalum deposited as tantalum oxide did not.

In Example 6 chromium and chromium oxide were compared. Sample LC1-23-45-3 shows that chromium effectively improved adhesion. Sample LC1-23-45-4 shows that chromium deposited as chromium oxide did not.

EXAMPLE 7

This example illustrates the use of an argon glow to increase the surface energy of the plastic substrate and improve the effectiveness of the adhesion-promoting layers of this invention.

This sample, labeled LC1-23-36-1 in Table III, was prepared with a titanium metal primer layer as described in Example 1, but with argon gas in the plasma pre-glow rather than air and with all the layers being laid down in one pass by the use of all the electrode positions in the sputtering machine.

The glow pressure was $1.7 \times 10^{-3}$ Torr with an argon flow of 38.9 sccm, a voltage of 1500 V, and a current of 75 mA. A titanium target in position 46 of FIG. 1 was powered at 0.26 kW with 10.3 sccm of argon to obtain a minichamber pressure of $3.0 \times 10^{-3}$ Torr. The resulting titanium layer caused the transmission of the uncoated substrate to be reduced by about 4 percentage points as discussed in Example 1. The silver target in position 48 of FIG. 1 was powered at 4.0 kW with 26.7 sccm of argon to obtain a minichamber pressure of $4.5 \times 10^{-3}$ Torr. The nichrome target in position 50 of FIG. 1 was powered at 0.84 kW with an argon flow of 19.9 sccm and a minichamber pressure of $3.0 \times 10^{-3}$ Torr. A linespeed of 20 mm/sec was used.

The resulting silver film was laminated to steel and salt fog-tested as described in Example 1. After about three days exposure only 5% of the sample surface was corroded and delamination was not observed between the silver layer and the PET.

EXAMPLE 8

For comparison purposes, the experiment of Example 7 was substantially repeated but without a surface pretreatment to increase the surface energy.

This sample, labeled as LC1-23-36-2 in Table III, was prepared with a titanium metal primer layer as described in Example 7, but without pre-glowing the substrate. To allow a direct comparison with Example 6, an argon flow of 38.9 sccm was introduced into the glow chamber but power was not applied to the glow rod. The titanium target was powered at 0.26 kW with 10.3 sccm of argon to obtain a minichamber pressure of $3.0 \times 10^{-3}$ Torr. The resulting titanium layer caused the transmission of the uncoated substrate to be reduced by about 4 percentage points. The silver target was powered at 4.0 kW with 26.7 sccm of argon to obtain a minichamber pressure of $4.5 \times 10^{-3}$ Torr. The nichrome target was powered at 0.84 kW with an argon flow of 19.9 sccm and a minichamber pressure of $3.0 \times 10^{-3}$ Torr. A linespeed of 20 mm/sec was used.

The resulting silver film was laminated to steel and salt fog-tested as described in Example 1. After about three days exposure, 50% of the sample surface was corroded. Thus, the corrosion resistance of the sample made in Example 8 is much lower than the sample described in Example 7. This demonstrates the advantage of pretreating the substrate to obtain optimum adhesion between the PET and the primer layer.

EXAMPLE 9

Mixtures of metals can serve as adhesion-promoting layers for the solver PET interface. In this example an 80/20 alloy of nickel and chromium, nichrome, is used.

This sample, labeled as LC1-22-89-1 in Table IV, was prepared with a nichrome metal primer layer. An air flow of 17.5 sccm was introduced into the glow chamber to obtain a pressure of $1.3 \times 10^{-2}$ Torr at 1500 volts and 75 mA. The nichrome target was powered at 0.10 kW with 15.3 sccm of argon to obtain a minichamber pressure of $3.0 \times 10^{-3}$ Torr. The resulting nichrome layer caused the transmission of the uncoated substrate to be reduced by about 5 percentage points. The silver target was powered at 4.0 kW with 26.0 sccm of argon to obtain a minichamber pressure of $4.5 \times 10^{-3}$ Torr. The top nichrome target (i.e., position 50 in FIG. 1) was powered at 0.84 kW with an argon flow of 19.9 sccm and a minichamber pressure of $3.0 \times 10^{-3}$ Torr. A linespeed of 20 mm/sec was used.

The resulting sample was adhered to steel and salt fog-tested as described above in Example 1. After a three day exposure no corrosion or delamination was observed as listed under sample LC1-22-89-1 in Table IV.

This experiment was repeated, varying the nichrome sputtering conditions so as to lay down a thinner layer, one giving a 2% reduction in transmission. The product of this experiment, sample LC1-22-88-2, was only slightly less effective at resisting corrosion as shown in Table IV.

EXAMPLES 10–11

The experiment of Example 1 was substantially repeated replacing the titanium primer layer with an indium primer layer (sample LC1-23-42-4) and with an aluminum primer layer (sample LC1-23-43-5). As shown in Table III, both of these metals were effective.

EXAMPLES 12–13

The experiment of Example 1 was substantially repeated halving (sample LC1-23-32-2) and doubling (sample LC1-23-32-4) the thickness of the titanium primer. As shown in Table III, each of these metals was effective. However, the thicker the primer layer the more effective the adhesion promotion.

EXAMPLE 14

This example shows that even with metal primers with melting points greater than 1100° C., some oxygen can be added to the plasma to reduce the visible absorption measured "in situ" caused by a given thickness of primer without eliminating the desired adhesion-promoting properties of the primer layer.

This sample was prepared in a sputtering machine similar to that shown in FIG. 1. A nichrome primer layer was deposited onto a pre-glowed film from an argon plasma power and linespeed (i.e., 8.6 kW at 150 mm/sec) which resulted in a 24 percentage point drop in the visible transmission of the substrate. This corresponds to an approximately 30 Å thick nichrome layer. Oxygen (93 sccm) was added to the nichrome sputtering plasma to a level which resulted in an increase in transmission of about 10 percentage points while keeping the target operating in the "metal mode." Silver and a nichrome protective layer were deposited onto the partially oxidized nichrome layer in a manner similar to that described above.

The resulting sample was adhered to steel and salt fog-tested as described in Example 1. After a three day exposure, no corrosion or delamination was observed. Thus, unlike the stoichiometric titanium oxide primer described in Example 2, the substoichiometric nichrome oxide in this example did function as an effective adhesion promoter.

As shown in Table IV, this result was further confirmed when a fully oxidized nichrome underlayer material, LC1-22-89-3, was prepared and tested and found to corrode as well.

EXAMPLES 15–16

These examples illustrate that primer metals with melting points lower than 1100° C. can be sputtered in the oxide mode as stoichiometric oxides and function as effective adhesion primers.

In this experiment the substrate was pre-glowed, an approximately 30 Å layer of zinc oxide was deposited, an approximately 1000 Å layer of silver was deposited, and an approximately 100 Å layer of nichrome was deposited in a single pass using all plasma positions in the machine shown in FIG. 1. This sample is labeled as LC1-23-43-2 in Table III. The gas pressure was at $1.2 \times 10^{-3}$ Torr with an air flow of 16.5 sccm, a voltage of 1500 V, and a current of 75 mA. The zinc target was powered at 1.04 kW with 5.0 sccm of argon, 4 sccm of nitrogen, 2 sccm of hydrogen, and 20 sccm of oxygen to obtain a minichamber pressure of $4.0 \times 10^{-3}$ Torr. (The zinc target was operating in the oxidized mode to produce essentially fully stoichiometric zinc oxide with no significant (i.e., <1%) visible absorption.) The silver target was powered at 4.0 kW with 26.2 sccm of argon to obtain a minichamber pressure of $4.5 \times 10^{-3}$ Torr. The nichrome target was powered at 0.84 kW with an argon flow of 21.3 sccm and a minichamber pressure of $3.0 \times 10^{-3}$ Torr.

The resulting sample was adhered to steel and salt fog-tested as described above in Example 1. After a three day exposure only 3% of the surface was corroded and delamination was not observed. Thus, unlike titanium oxide, tungsten oxide, nickel oxide, etc., when zinc is deposited in the oxygen mode as a stoichiometric oxide, it still serves as an effective adhesion primer.

In a second experiment (sample LC1-23-42-4), similar results were found for the stoichiometric oxide of indium, another metal with a melting point less than 1100° C.

EXAMPLE 17–19

A review of the results in Example 1, 12 and 13 showed that increasing primer thickness decreased reflectivity. These three experiments were repeated but with an $O_2$ glow inserted after the titanium layer deposit and before the silver deposit. The results of these experiments (samples LC1-23-35-1, LC1-23-35-2 and LC1-23-35-3 in Table III) show that the $O_2$ treatment helped oxidize the less than fully up-oxidized thicker titanium layers (as shown by improved reflectance), but that the "2%" material was substantially unaffected, indicating full up-oxidation as formed.

EXAMPLE 20

In Table IV, reflectance is given in two columns before heat treatment ("Rvis BHT") and after a 30 minute, 77° C. heat treatment applied to the laminated final product ("Rvis AHT"). This treatment is an accelerated post-production up-oxidation for the underlayer and, as the table shows, can be advantageous in improving transparency of the underlayer and thus reflector performance.

What is claimed is:

1. A metal-on-plastic material comprising
   a plastic substrate having a surface,
   a 3 to 200 Å thick, substantially transparent first layer sputter-deposited upon the surface of the substrate comprising metal selected from the group consisting of hafnium, zirconium, tantalum, titanium, niobium, tungsten, vanadium, molybdenum, chromium, nickel and alloys thereof, the metal in said first layer being deposited in the form of metal or substoichiometric oxide, and
   a second layer sputter-deposited upon the first layer comprising 100–10,000 Å of metal selected from the group consisting of copper, silver, gold, palladium, rhodium, iridium and alloys thereof.

2. The material of claim 1 wherein the second layer comprises silver.

3. The material of claim 1 wherein the first layer is present as metal.

4. The material of claim 1 wherein the first layer is present as a substoichiometric oxide.

5. The material of claim 1 wherein the plastic substrate comprises polyester film.

6. The material of claim 5 wherein the polyester comprises poly(ethyleneterephthalate).

7. The material of claim 1 wherein the substrate has a surface energy greater than 50 dynes per $cm^2$.

8. The material of claim 1 additionally comprising a protective layer upon the surface of the second layer.

9. The material of claim 8 wherein the protective layer comprises a material selected from the group consisting of metals, metal oxides, metal nitrides, metal sulfides and metal carbides upon the second layer and wherein a coating comprising a material selected form the group consisting of silica and polyolefin is provided upon the protective layer.

10. The material of claim 8 wherein the plastic substrate comprises a plastic film having two surfaces, one surface being the surface upon which the first layer is located and additionally comprising a layer of adhesive adhered to the other surface.

11. The material of claim 8 additionally comprising a layer of adhesive upon the protective topcoat.

12. The material of claim 10 wherein the second layer is a light-reflective layer.

13. The material of claim 12 wherein the second layer comprises silver.

14. The material of claim 11 wherein the second layer is a light-reflective layer.

15. The material of claim 14 wherein the second layer comprises silver.

16. A metal-on-plastic material comprising
    a plastic substrate having a surface,
    a 3 to 200 Å thick, substantially transparent first layer sputter-deposited upon the surface of the substrate comprising metal selected from the group consisting of aluminum, tin, antimony, indium, zinc, bismuth, cadmium, and alloys thereof, the metal in said first layer being deposited in the form of metal or substoichiometric oxide, and
    a light-reflective second layer sputter-deposited upon the first layer comprising 500–3000 Å of metal selected from the group consisting of copper, silver, gold, palladium, rhodium, iridium and alloys thereof.

* * * * *